(12) United States Patent
Chan et al.

(10) Patent No.: US 11,283,405 B2
(45) Date of Patent: Mar. 22, 2022

(54) OSCILLATOR CIRCUIT

(71) Applicant: City University of Hong Kong, Kowloon (HK)

(72) Inventors: Chi Hou Chan, Kowloon (HK); Hai Feng Zhou, Kowloon (HK); Kam Man Shum, Kowloon (HK)

(73) Assignee: City University of Hong Kong, Kowloon (HK)

( * ) Notice: Subject to any disclaimer, the term of this patent is extended or adjusted under 35 U.S.C. 154(b) by 0 days.

(21) Appl. No.: 16/931,790

(22) Filed: Jul. 17, 2020

(65) Prior Publication Data

US 2022/0021337 A1 Jan. 20, 2022

(51) Int. Cl.
*H03B 5/12* (2006.01)

(52) U.S. Cl.
CPC ..... *H03B 5/1212* (2013.01); *H03B 2200/004* (2013.01)

(58) Field of Classification Search
CPC .................................................. H03B 5/1212
USPC ........................................................ 331/117 R
See application file for complete search history.

(56) References Cited

U.S. PATENT DOCUMENTS

| | | | | |
|---|---|---|---|---|
| 7,649,424 B2* | 1/2010 | Cusmai | ............... | H03B 5/1215 |
| | | | | 331/117 R |
| 9,923,599 B1* | 3/2018 | Xue | ...................... | H04B 3/06 |
| 2012/0062287 A1* | 3/2012 | Jang | ..................... | H03B 5/1243 |
| | | | | 327/156 |
| 2013/0181783 A1* | 7/2013 | Upadhyaya | .......... | H03B 5/1228 |
| | | | | 331/117 FE |
| 2014/0084971 A1* | 3/2014 | Kuo | ..................... | H03B 5/1253 |
| | | | | 327/119 |

* cited by examiner

*Primary Examiner* — Joseph Chang
(74) *Attorney, Agent, or Firm* — Renner Kenner Greive Bobak Taylor & Weber

(57) ABSTRACT

An oscillator circuit includes a core stage having a voltage controlled oscillator arranged to output an output oscillation signal, and an input stage coupled to the output stage via an induction coupling, and arranged to receive an input oscillation signal; wherein the output oscillation signal includes an output oscillation frequency substantially equals to a multiplication of an input oscillation frequency of the input oscillation signal.

18 Claims, 9 Drawing Sheets

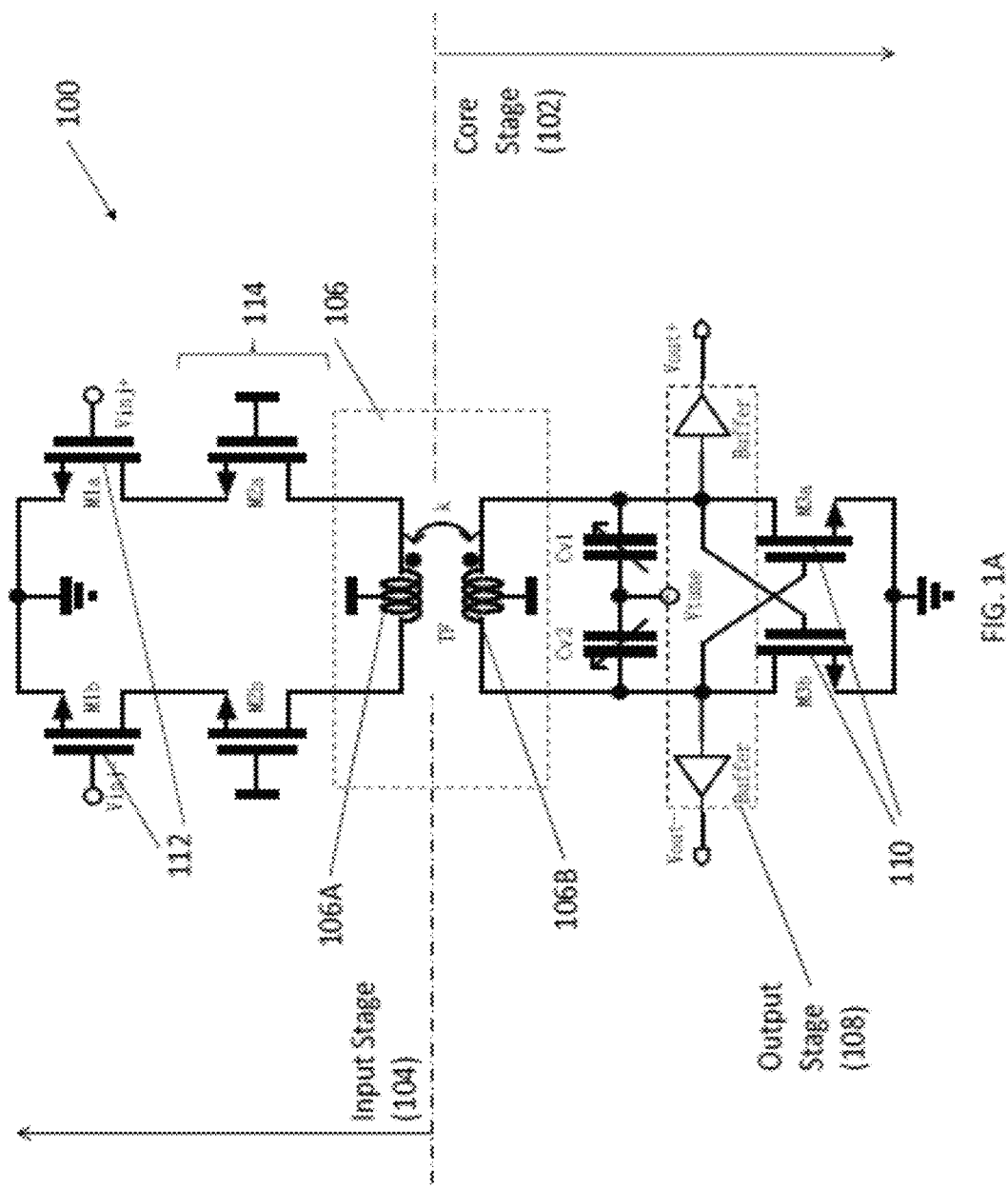

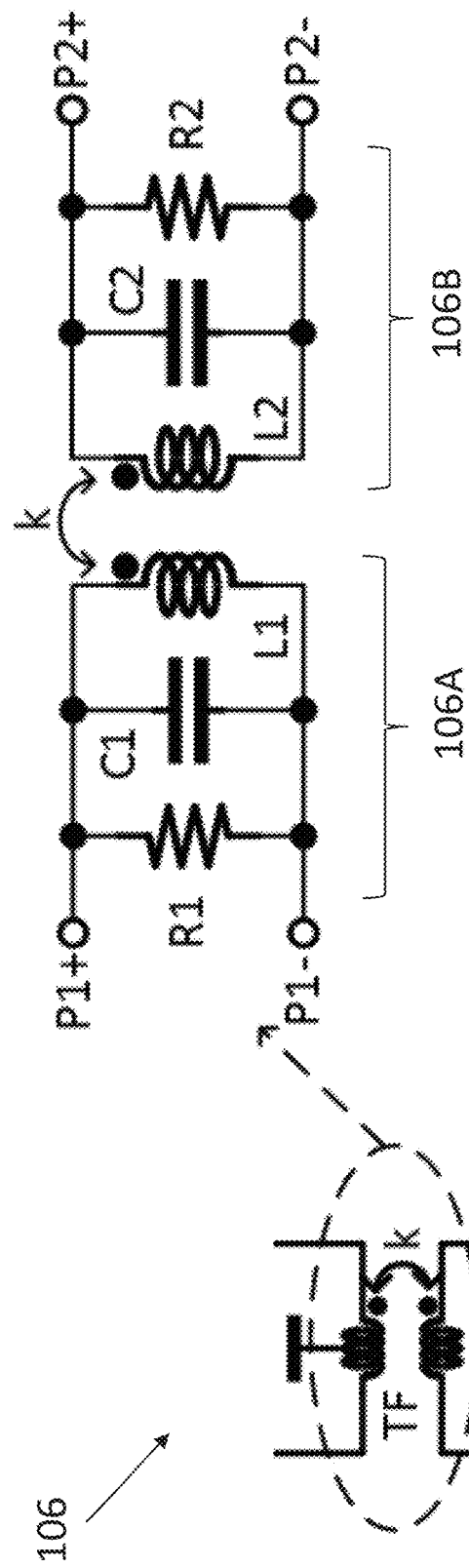
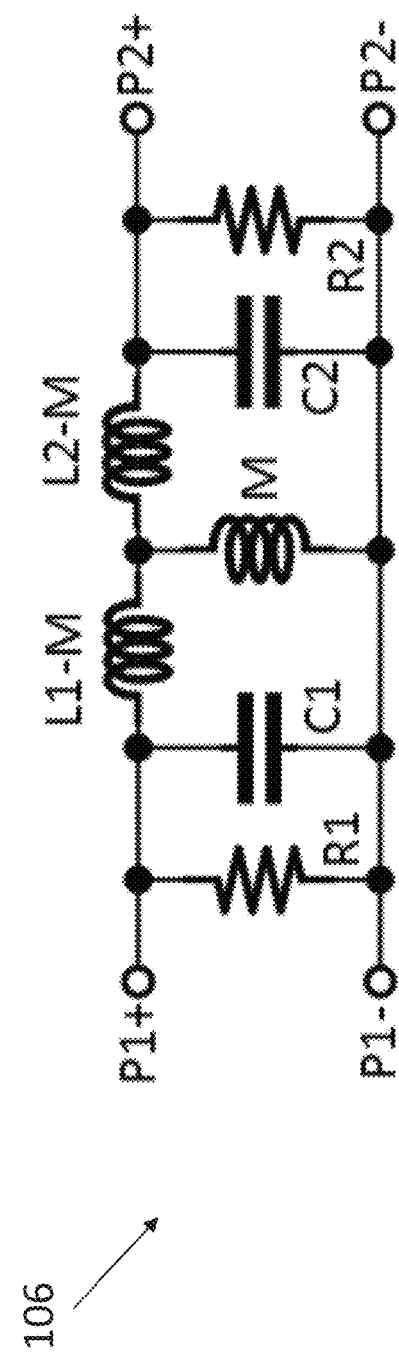
FIG. 1B
FIG. 1C

OSCILLATOR CIRCUIT

TECHNICAL FIELD

The present invention relates to an oscillator circuit, and particularly, although not exclusively, to a VCO-based oscillator.

BACKGROUND

In many different electronic applications, oscillation signal is necessary to support the operations of different circuit components. For example, a stable clock signal is an essential component for processor to operate to perform different instructions.

In some high speed/frequencies applications such as wireless communications, the transmitted signals may be over GHz range which therefore requires the circuit to operate in an extremely high frequency, and accordingly the circuit also require a stable source of oscillation signal with high oscillation frequencies.

SUMMARY OF THE INVENTION

In accordance with a first aspect of the present invention, there is provided an oscillator circuit comprising: a core stage including a voltage controlled oscillator arranged to output an output oscillation signal, and an input stage coupled to the output stage via an induction coupling, and arranged to receive an input oscillation signal; wherein the output oscillation signal includes an output oscillation frequency substantially equals to a multiplication of an input oscillation frequency of the input oscillation signal.

In an embodiment of the first aspect, the core oscillation frequency substantially equals to a triple of the input oscillation frequency.

In an embodiment of the first aspect, the input stage is further arranged to inject a subharmonic signal to the core stage such that the output oscillation frequency component is generated in the core stage.

In an embodiment of the first aspect, the induction coupling includes a magnetic coupling.

In an embodiment of the first aspect, the input stage further comprises a primary coil and the core stage further comprises a secondary coil magnetically coupled with the primary coil to form the induction coupling.

In an embodiment of the first aspect, the combination of the primary coil and the secondary coil defines a transformer.

In an embodiment of the first aspect, an output port of the transformer is operable as a signal source of the voltage controlled oscillator.

In an embodiment of the first aspect, the core stage further comprises a pair of variable capacitors coupled with the secondary coil, wherein the pair of variable capacitors is arranged to manipulate a center frequency of the voltage controlled oscillator.

In an embodiment of the first aspect, the center frequency of the voltage controlled oscillator matches with a self-resonate frequency of the second coil.

In an embodiment of the first aspect, the pair of variable capacitors are further arranged to compensate process and/or temperature variations in the core stage during an operation of the oscillator circuit.

In an embodiment of the first aspect, the pair of variable capacitors include a pair of varactors.

In an embodiment of the first aspect, the core stage further comprises a pair of cross-coupled transistors connected with the secondary coil to define a core of the voltage controlled oscillator.

In an embodiment of the first aspect, the pair of core transistors are cross-coupled to generate a negative impedance.

In an embodiment of the first aspect, the circuit further comprises an output stage arranged to output the output oscillation signal generated by the core of the voltage controlled oscillator.

In an embodiment of the first aspect, the output stage includes a pair of buffer circuits connected to the core of the voltage controlled oscillator.

In an embodiment of the first aspect, the input stage further comprises a pair of injection transistors arranged to receives the input oscillation signal.

In an embodiment of the first aspect, the pair of injection transistors are biased at an optimized gate voltage so as to widen a locking range of the voltage controlled oscillator.

In an embodiment of the first aspect, the pair of injection transistors are biased at an optimized gate voltage so as to maximize the subharmonic signal.

In an embodiment of the first aspect, the input stage further comprises a cascode stage between the pair of injection transistors and the induction coupling, wherein the cascode stage arranged to maintain a constant capacitance in the inductive coupling during a switching operation of the pair of injection transistors.

In an embodiment of the first aspect, the cascode stage includes one or more transistors.

In an embodiment of the first aspect, the voltage controlled oscillator includes a dual-band voltage controlled oscillator.

In an embodiment of the first aspect, the dual-band voltage controlled oscillator and the inductive coupling are arranged to resonate at two different resonant frequencies $\omega L$ and $\omega H$.

In an embodiment of the first aspect, a ratio of the two different resonant frequencies $\omega L/\omega H$ is related to a coupling coefficient k of the inductive coupling.

In an embodiment of the first aspect, the coupling coefficient k is related to the following representations:

$$\rho = \frac{ReZ_{11}(\omega_L)}{ReZ_{11}(\omega_H)} \approx \frac{k+(\gamma-1)}{k-(\gamma-1)}; \text{ and } \frac{\omega_L}{\omega_H} = \sqrt{\frac{1+\gamma^2-\sqrt{\Delta}}{1+\gamma^2+\sqrt{\Delta}}}$$

where $\Delta=(1-\gamma^2)^2+4k^2\gamma^2$; wherein $Z_{11}(\omega)$ denotes a magnitude peak corresponding to a pole frequency, $\gamma$ is a parameter associated with an LRC-circuit model of the inductive coupling; and $\rho$ is a ratio of an equivalent parallel resistance of the LRC-circuit model in two frequency modes.

In an embodiment of the first aspect, each of the two different resonant frequencies $\omega_L$ and $\omega_H$ defines two respective locking ranges, wherein the two locking ranges at least partially overlaps with each other so as to define a wide and continuous locking range.

BRIEF DESCRIPTION OF THE DRAWINGS

Embodiments of the present invention will now be described, by way of example, with reference to the accompanying drawings in which:

FIG. 1A is a schematic diagram of an injection-locked frequency tripler circuit in accordance with one embodiment of the present invention;

FIG. 1B is a schematic diagram of an equivalent LRC-circuit model of the transformer coupling of the oscillator circuit of FIG. 1A;

FIG. 1C is a schematic diagram of an T-model of the transformer coupling of the oscillator circuit of FIG. 1A;

DETAILED DESCRIPTION OF THE PREFERRED EMBODIMENT

Figure 2:
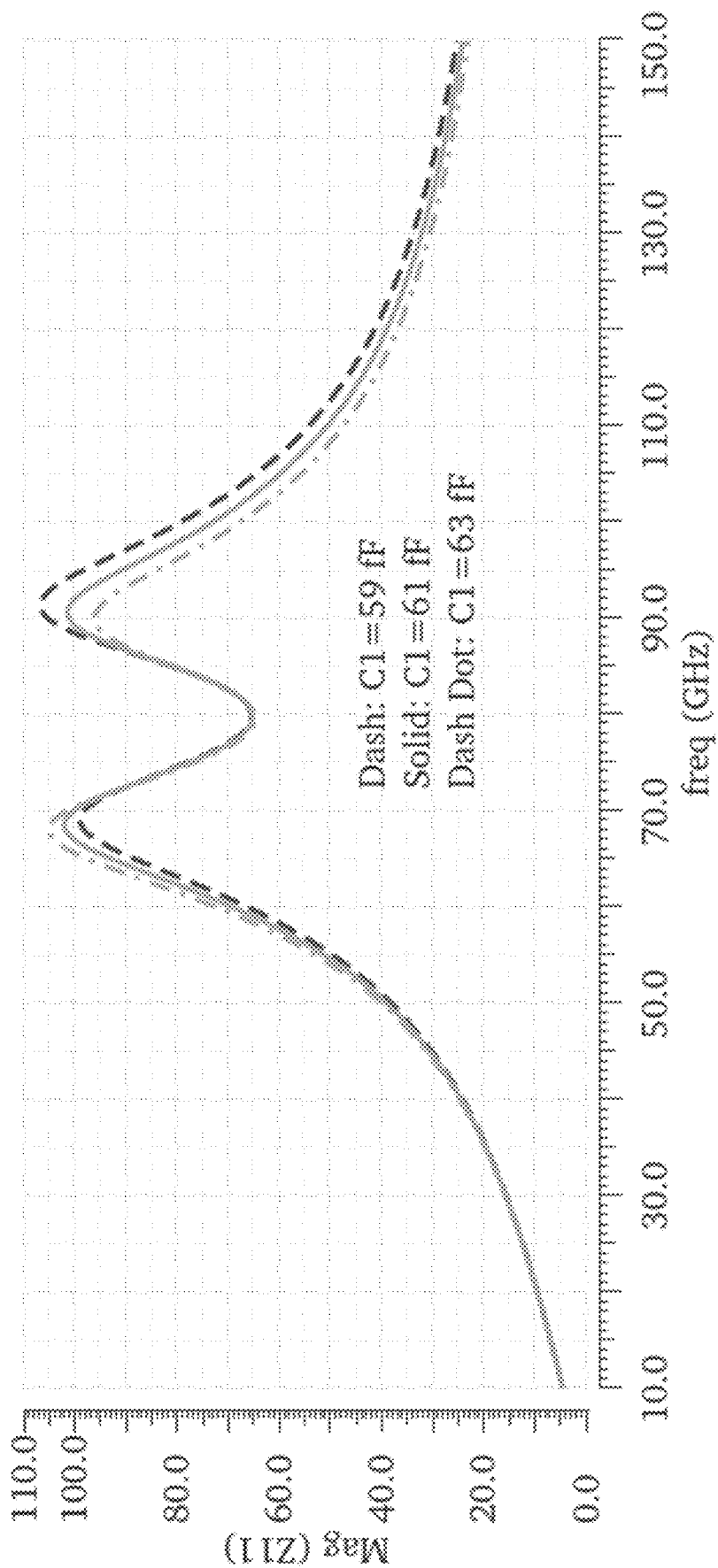
FIG. 2 is a plot showing simulated magnitude of $Z_{11}(\omega)$ with different C1 in the circuit models of FIGS. 1B and 1C.

The inventors have, through their own research, trials and experiments, devised that CMOS technology operating in millimetre wave (MMW) frequency band may be used in different applications. In some example embodiments, the cutoff frequency $f_{max}$ of the 65 nm CMOS process has exceeded 200 GHz.

In another example embodiment, CMOS technology may enable the monolithic integration of the digital-rich baseband circuits with RF or MMW blocks together. This example embodiment may eliminate the need for external connections, e.g., wire-bonding and flip-chip mounting, to avoid performance degradation and to increase sub-system reliability. In addition, the cost of the chip may be reduced when the operation frequency of the designed circuit is increased as the dimensions of passive components are smaller.

In MMW circuits, one of the key components is the local oscillator which provides a stable and pure oscillating source to modulate signals to the targeted channel. The function of the oscillator is to down-convert high frequency signals to low frequency in a receiver or to up-convert baseband signals to high frequency in a transmitter. Therefore, there are corresponding requirements for the frequency range and spectral purity of the signal source.

In one example embodiment, a W-band and low dc power transformer coupled injection-locked frequency tripler may be used, with its locking range (LR) being limited since the dual-resonance characteristic of the transformer has not been utilized. In another example, a sub-harmonic injection-locked oscillator fabricated in a SiGe-BiCMOS technology may obtain a 3.8% DC-to-RF efficiency and its locking range is 12.3% from 177 to 201 GHz. With different switching conditions, multi-band operation may be realized to improve the locking range.

Alternatively, an oscillator circuit may use the switching-inductor loaded transformer topology to provide various return-paths for multi-bands, which may achieve a total locking range of 9.7% around 63 GHz. Yet alternatively, based on a stacked boosting technique, the negative resistance of the oscillation core could be highly enhanced. In these examples, a transformer coupling may be employed to widen the locking range, however these example circuits fails to utilized the dual-resonance characteristic of the transformer coupling.

In one preferable embodiment, there is provided a wide locking range (LR) injection-locked frequency tripler (ILFT) which utilizes the dual-resonant frequency characteristic of a transformer. Preferably, by changing the resonant resistance of the transformer based on a careful selection of the bias voltage of the varactors, dual-band oscillation may be achieved. Subharmonic signal is then injected into the dual-band VCO by magnetic coupling of the transformer. Advantageously, since the oscillator has two locking ranges around the two adjacent resonant frequencies of the VCO, the two LRs can overlap and merge to a single-band wide band LR.

With reference to FIG. 1A, there is shown an embodiment of an oscillator circuit 100 comprising: a core stage 102 including a voltage controlled oscillator arranged to output an oscillation signal, an input stage 104 coupled to the core stage via an induction coupling 106, and arranged to receive an input oscillation signal; wherein the output oscillation signal includes an output oscillation frequency substantially equals to a multiplication of an input oscillation frequency of the input oscillation signal.

In this example, the oscillator circuit 100, also named as an injection-locked frequency tripler circuit described in this disclosure, may be applied as a circuit component in other electrical/electronic circuit, preferably as a high frequency oscillator for providing a stable and oscillation signal for other parts or stages in the electrical/electronic circuit. The injection-locked frequency tripler circuit 100 comprises three main stages, including an input stage 104 which receives an injection frequency which "sets" the output frequency of the oscillation signal, a core stage 102 arranged to generate the output oscillation signal, and an output stage 108 arranged to output the generated signal to other parts or stages of an electrical circuit. Preferably, the output oscillation frequency is fixed at certain multiplication, such as a triple of the input frequency, such that the oscillator circuit may be used as a frequency tripler in the circuit. For example, an input oscillation signal of 80/3 GHz may be eventually converted to an output oscillation signal of 80 GHz.

Referring to FIG. 1A, the input stage 104 and the core stage 102 are coupled together with two inductive coils, i.e. a primary coil 106A and a secondary coil 106B respectively form in the input stage 104 and the core stage 102, thereby forming a transformer 106 which completes the inductive/magnetic coupling. The transformer 106 in the middle not only couples the two stages, but also provides the necessary high frequency signal for generating the high frequency output oscillation. Preferably, the input stage 104 may further inject a subharmonic signal to the core stage 102, via the transformer 106, such that the output oscillation frequency component is generated in the core stage 102 and then the output buffer stages 108 used to output signals.

Without wishing to be bound by theory, a transformer may be used as a resonator. The inventors devises that transformers can achieve a better phase noise performance for the intrinsic higher frequency selectivity. In addition, a transformer coupling technique allows the possibility of having dual-resonance because of its multiorder characteristic. Preferably, the transformer may be designed to yield two possible modes of oscillation, and preferably, two frequencies should not be too far away for some example applications.

The simplified schematic of the design ILFT 100 is shown in FIG. 1A, and with reference also to FIGS. 1B and 1C, the equivalent circuit model of the transformer coils 106A/106B consists of two coupled inductors, two capacitors (including parasitic capacitance) and two resistors. For circuit analysis, the T-model as shown in FIG. 1C may also be employed to represent the transformer 106, where the mutual inductance M is equal to $k\sqrt{L_1L_2}$. Preferably, transformer coupling may yield two possible modes of oscillation at frequency $\omega_L$ and $\omega_H$, which can be expressed as:

$$\omega_{L,H} = \omega_1 \sqrt{\frac{1+\gamma^2 \pm \sqrt{\Delta}}{2(1-k^2)}} \quad (1)$$

where $\omega_1 = 1/\sqrt{L_1C_1}$, $\omega_2 = 1/\sqrt{L_2C_2} = \gamma\omega_1$, $\Delta = (1-\gamma^2)^2 + 4k^2\gamma^2$, and assume $Q_1Q_2 \gg 1$. Notice that $\omega_z = \omega_1\gamma/\sqrt{1-k^2}$ and $\omega_L < \omega_z < \omega_H$.

The simplest configuration of the injection-locked frequency tripler 100 is obtained by loading either port of the transformer-based resonator by a negative conductance $-G_m$. Therefore it is necessary to determine which frequency to build up to oscillation. The ratio of the equivalent parallel resistance of the transformer 106 in two frequency modes can be calculated as:

$$\rho = \frac{ReZ_{11}(\omega_L)}{ReZ_{11}(\omega_H)} \approx \frac{k+(\gamma-1)}{k-(\gamma-1)} \quad (2)$$

From (2), it can be observed that $\rho=1$ when $\gamma=1$. It means that when $\omega_1=\omega_2$ (R1 and R2 do not need to be the same), $Z_{11}(\omega)$ has two equal magnitude peaks corresponding to the pole frequencies. At this point, the oscillator may operate at those frequencies at random. The parameter $\rho$ can be tuned by changing $\omega_1$ and/or $\omega_2$ through changing the capacitor $C_1$ and/or $C_2$, which is similar to varactor tuning.

With reference to FIG. 2, there is shown the simulated magnitude of $Z_{11}(\omega)$ with different $C_1$ when $f_L$=70 GHz and $f_H$=90 GHz. In a feedback-type oscillator, it might oscillate at wo if the loop gain satisfies the following two conditions:

$$G_m \cdot ReZ_{11}(\omega_0) \geq 1 \quad (3a)$$

$$ImZ_{11}(\omega_0)=0 \quad (3b)$$

Equation (3b) yields two possible modes of oscillation at frequencies $f_L$ and $f_H$ as an example. Now consider (3a) to determine which mode of the oscillation build up. When $C_1$=61 fF, $ReZ_{11}(\omega_L)=ReZ_{11}(\omega_H)$ which means $\gamma=1$ and $\omega_1=\omega_2$, the circuit is in metastable state. When $C_1$=63 fF, it can obtain $\rho>1$ when $\gamma>1$ to satisfied the first oscillation at frequency $\omega_L$ while when C1=59 fF, it can obtain $\rho<1$ when $\gamma<1$ to satisfied the first oscillation at frequency $\omega_H$. It is convenient to realize the steep change in frequency response of the transformer tank.

To gain insight in the relationship of $\omega_L/\omega_H$ with k and $\gamma$, the ratio of the two resonant frequencies $\omega_L/\omega_H$ as a function of the parameters k and $\gamma$ is shown in (4) from (1):

$$\frac{\omega_L}{\omega_H} = \sqrt{\frac{1+\gamma^2 - \sqrt{\Delta}}{1+\gamma^2 + \sqrt{\Delta}}} \quad (4)$$

Figure 3:
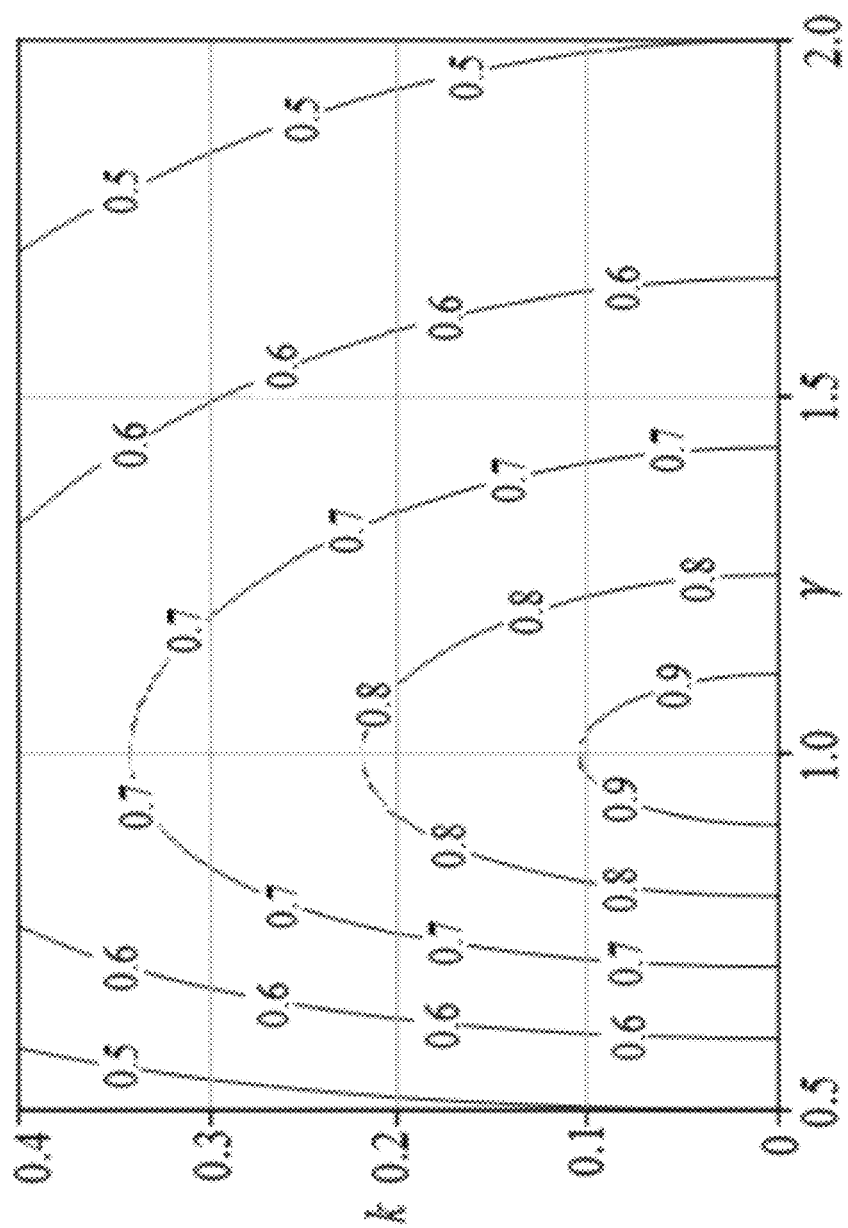
FIG. 3 is a plot showing $\omega_L/\omega_H$ a function with k and γ.

FIG. 3 shows the contour lines of the tuning range of $\omega_L/\omega_H$. It can be observed that a larger k pushes the two frequency poles away from each other. Preferably, the parameter of k should be chosen in the line of $\gamma=1$ according to the value of $\omega_L/\omega_H$. Referring to the ILO model, a large LR may be achieved by making $|\angle\vec{Z}_{11}|$ smaller than $\alpha_{lock}=\sin^{-1}(|I_{inj}|/|I_{osc}|)$ over a large frequency range of a transformer tank.

Referring also to FIG. 2, $Z_{11}(\omega)$ exhibits two peaks because of the position of the poles $\omega_L$ and $\omega_H$ and zero $\omega_z$. The phase of $Z_{11}(\omega)$ can be analyzed as the sum of the phase contributions of zero and each pole.

Figure 4:
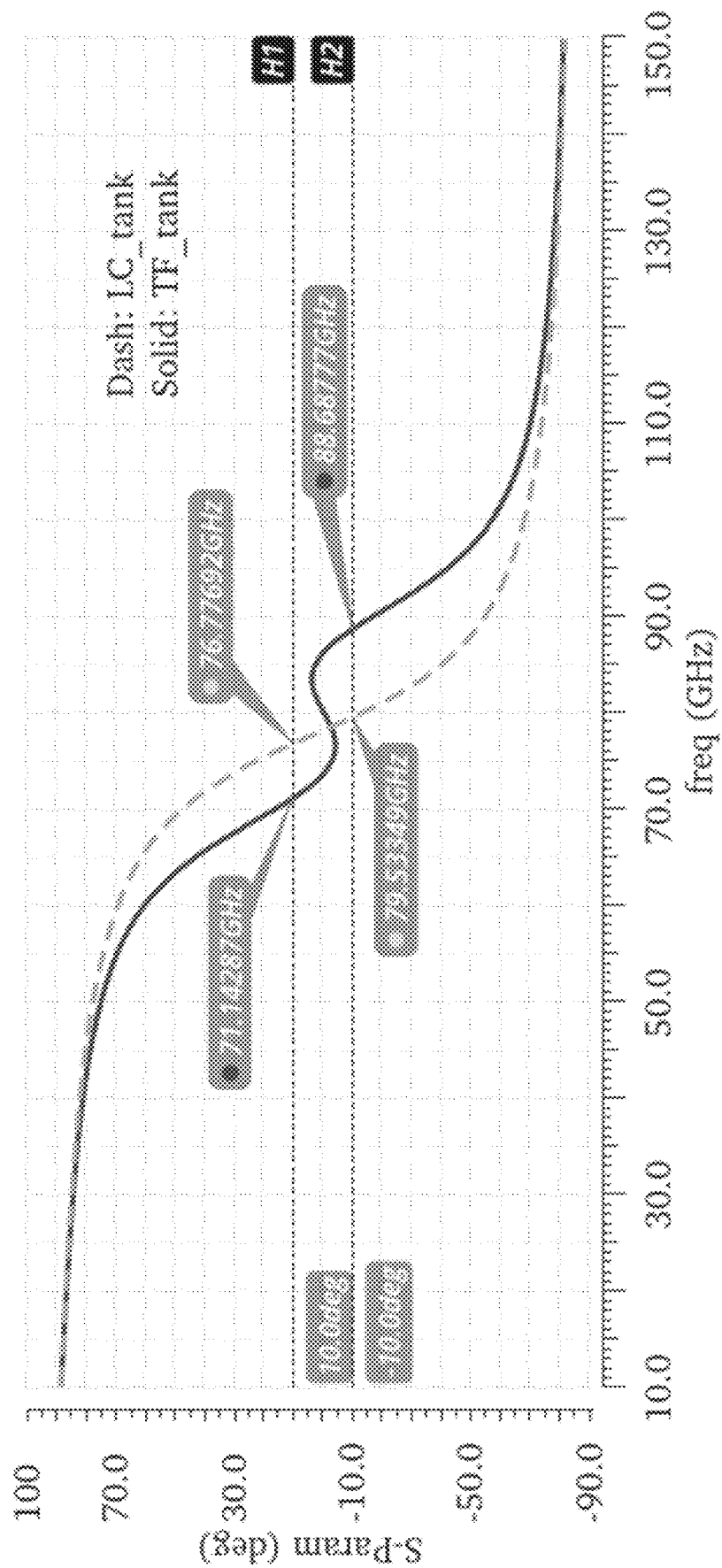
FIG. 4 is a plot showing a phase diagram of a LC-tank and transformer tank.

Referring to FIG. 4, the phase contributions on Bode diagram are simulated, where the dash line is for the LC tank and the solid line is for the transformer tank. The phase drops off with a slope of $-\pi Q$/decade at poles and rises at $\pi Q$/decade at zero (poles and zero are assumed to have the same Q=5). If we assume that $\alpha_{lock}$=10°, the LC tank LR is 2.75 GHz (76.78 to 79.53 GHz) or 3.52% of the center frequency. However, the LR of the transformer tank may be extended to 17.55 GHz (71.14 to 88.69 GHz) or 21.96% of the transformer tank.

With reference back to FIG. 1, the transformer coupling technique may be applied as an ILO, and each of the two different resonant frequencies $\omega_L$ and $\omega_H$ defines two respective locking ranges. Preferably, the two locking ranges at least partially overlaps with each other so as to define a wide and continuous locking range, therefore the whole LR will be greatly increased. In one example embodiment, the two frequencies of $f_L$=70 GHz and $f_H$=90 GHz are selected, then k is around 0.25 as shown in FIG. 3. Therefore, the transformer is designed to have a low coupling coefficient. Meanwhile, the injected current can be injected through the second coil of the transformer, which can further simplify the circuit structure.

As described above, an output port of the transformer 106 is operable as a signal source of the voltage controlled oscillator (VCO), preferably a dual-band VCO, the transformer 106 output may be further connected to a core of the voltage controlled oscillator, such as a pair of cross-coupled transistors 110 connected with the secondary coil to define a core of the voltage controlled oscillator. Referring to FIG. 1, transistors M3a and M3b form the core of the oscillator and are cross-coupled so as to generate the required negative impedance.

In addition, the oscillator circuit further comprises an output stage arranged to output the output oscillation signal generated by the core of the voltage controlled oscillator. For example, the output from the VCO may be further coupled directly using buffer stages. As shown in FIG. 1, a pair of buffer circuits may be connected to the core of the voltage controlled oscillator.

In addition, varactors (Cv1 and Cv2) or other variable capacitor devices may be used for manipulating a center frequency of the voltage controlled oscillatorall i.e. facilitating tuning of the VCO center frequency ($\omega_1$) to match the self-resonant frequency of the second coil and/to compensate for process and temperature variations which may cause a drift of the operation frequencies generated by the LC components. Tuning of the varactors and the effects of the tuning will be further described in this disclosure.

Preferably, the input stage 104 further comprises a pair of injection transistors 112 arranged to receives the input oscillation signal. The injection into the VCO is performed using pseudo differential transistors M1a and M1b whose inputs may be driven by the injected signal, e.g. 27 GHz, which is converted into differential signals through a balun. To achieve the widest LR and maximum third harmonic, the injection transistors M1a and M1b may be biased at the optimized gate voltage of 0.2 V to maximize the subharmonic signal.

Additionally or optionally, due to the highly non-linearity of the tripler devices, cascode stages 114, such as transistors M2a and M2b, may be added to keep the capacitance of the tank roughly constant during the switching operation.

With these components, the tripler may be implemented based on the following key steps and considerations:
- maintaining equivalent (or comparable) impedances at the two frequencies;
- maintaining a self-resonant frequency of the two ports being the same, and changing the tuning voltage using a varactor may adjust the self-resonant frequency;
- selecting a "reasonable" coupling coefficient of the transformer according to the layout; and
- the locking range of the two resonant frequencies needs to cover each other to form a continuous locking range so as to achieve a wide locking range.

Preferably, the design of transformer mainly focuses on coupling coefficient, but has little relation with turn ratio. In order to realize the dual band characteristic, the coupling coefficient is related to the ratio of VCO dual resonance frequency, and the relationship is shown in FIG. 2, $\omega_L/\omega_H$ as a function with k and γ and equations (2) and (4) as described above.

Figure 5:
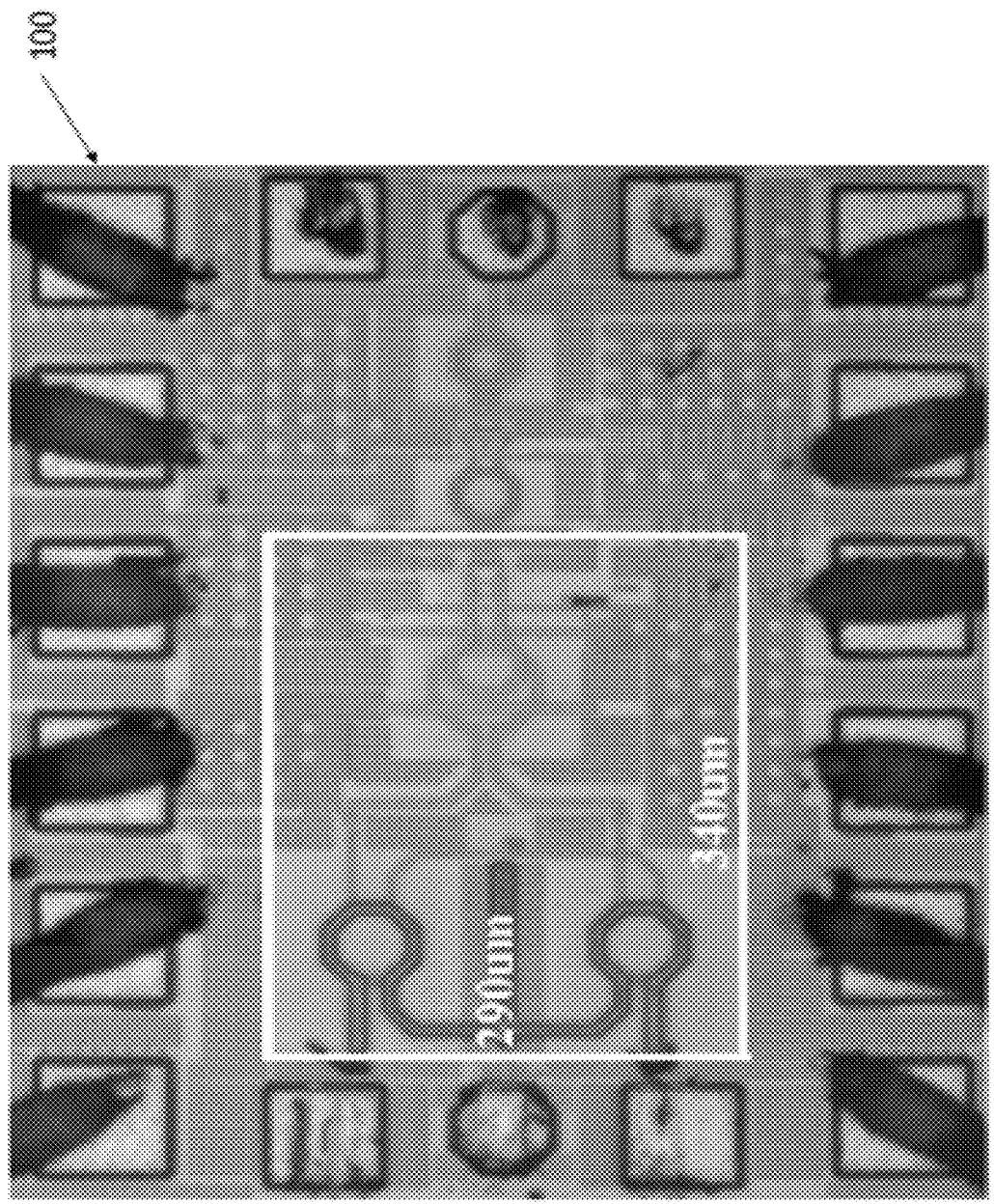
FIG. 5 is an image showing an implementation of the injection-locked frequency tripler circuit in accordance with an embodiment of the present invention.

With reference to FIG. 5, an embodiment of the injection-locked frequency tripler circuit 100 was fabricated and tested. In this experiment, a wide locking range ILFT based on a dual-band VCO is designed and fabricated in a 65 nm 1P9M GP CMOS process.

Figure 6:
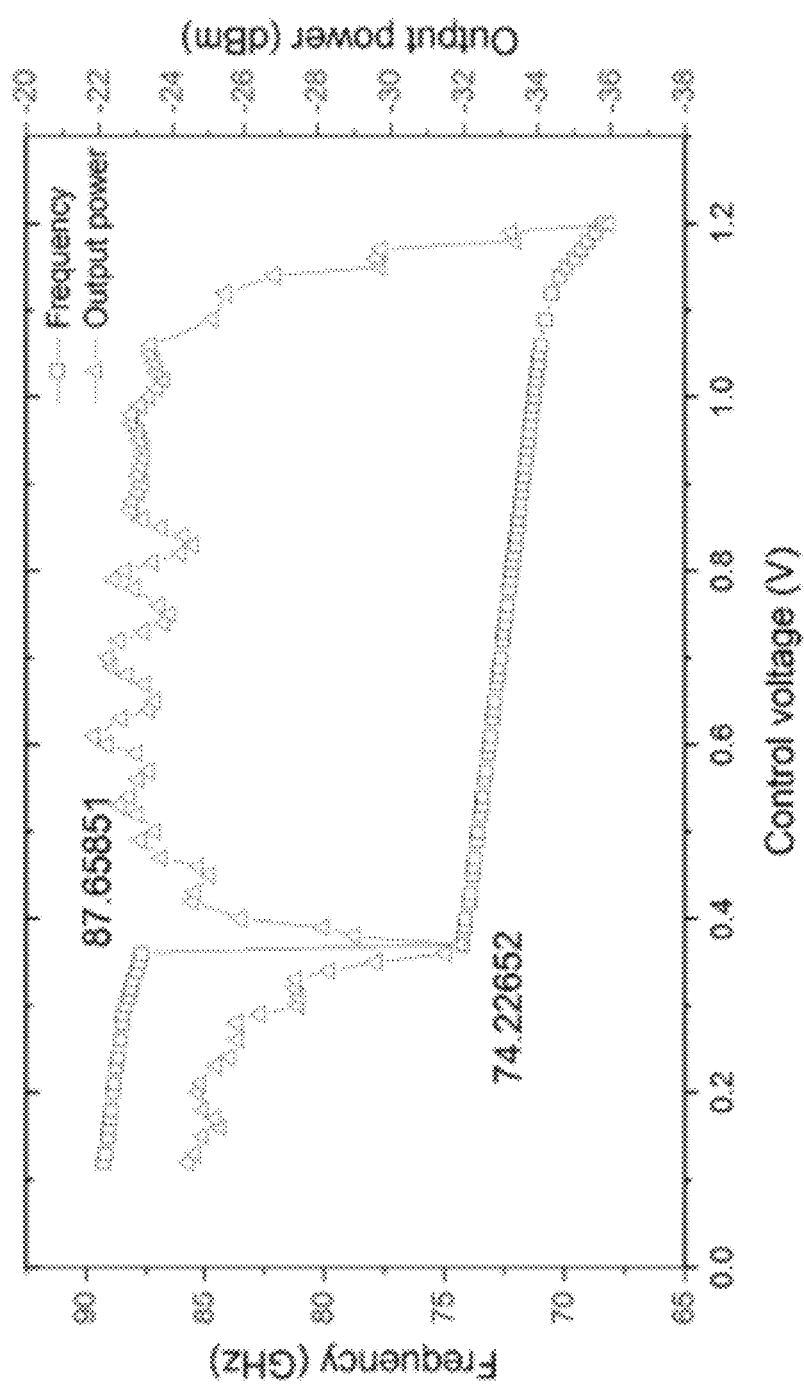
FIG. 6 is a plot showing measured output frequency and output power of the core oscillator circuit without injection signals of FIG. 5.

In this example, the core area of the ILFT is 290 μm×340 μm. Measured results of the operating frequency and output power against the control voltage are shown in FIG. 6 without injection signals. It can be seen that the tuning range is from 87.66 to 89.8 GHz for 0 V<$V_{tune}$<0.36 V and from 68.42 to 74.23 GHz for 0.36 V<$V_{tune}$<1.2 V. As described earlier, the frequency step of the VCO can be achieved by changing the self-resonant frequency at one terminal of the transformer. It is found that when the oscillator is oscillating at one of these two frequencies ($\omega_L$ and $\omega_H$), it is easy to force the oscillator to change the oscillating frequency. The varactors in the transformer tank may be used to calibrate the self-resonance frequency for frequency hopping.

With reference to FIG. 6, it may be observed that the minimum output power occurs at the sudden jump of the output frequency. The reason is that $|Z_{11}(\omega)|$ experiences a relative minimum if $\omega_1/\omega_2$ is equal to the desired ratio of 1 when sweeping the control voltage.

Figure 7:
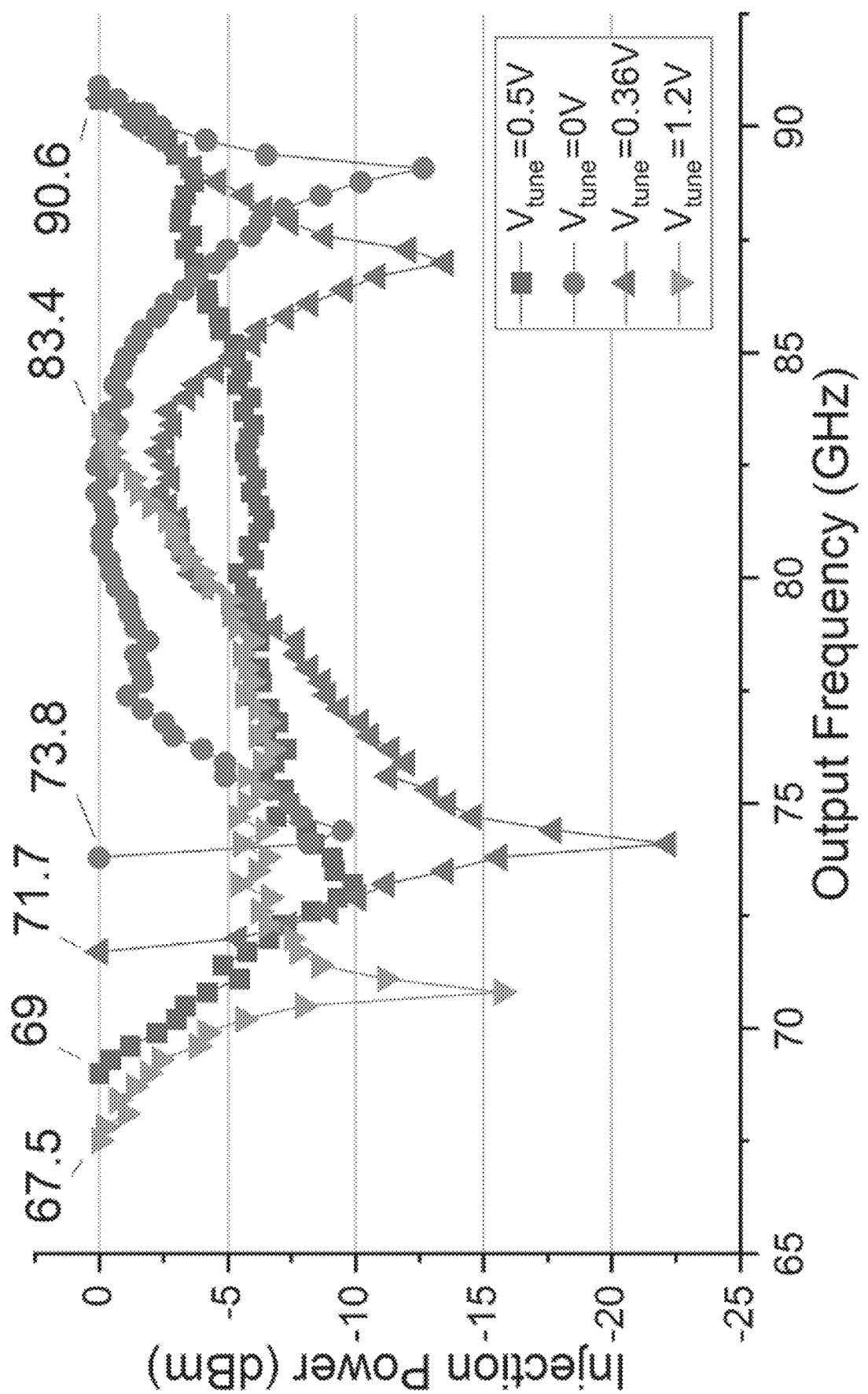
FIG. 7 is a plot showing measured input sensitivity curve at $V_{tune}$=0, 0.36, 0.5 and 1.2 V.

Referring to FIG. 7, there is shown the sensitivity of the LR to the injected signal, when $V_{tune}$=0; 0.36; 0.5 and 1.2 V. At $V_{tune}$=0 V, an injected signal power 0 dBm provides two non-overlapping LRs. At $V_{tune}$=0.36 V, the dual resonance effect may be the most significant. At $V_{tune}$=0.5 V, the two LRs overlap and they merge to a single-band wideband LR at 0 dBm injection power. At $V_{tune}$=1.2 V, it provides only a single low-band LR.

Figure 8:
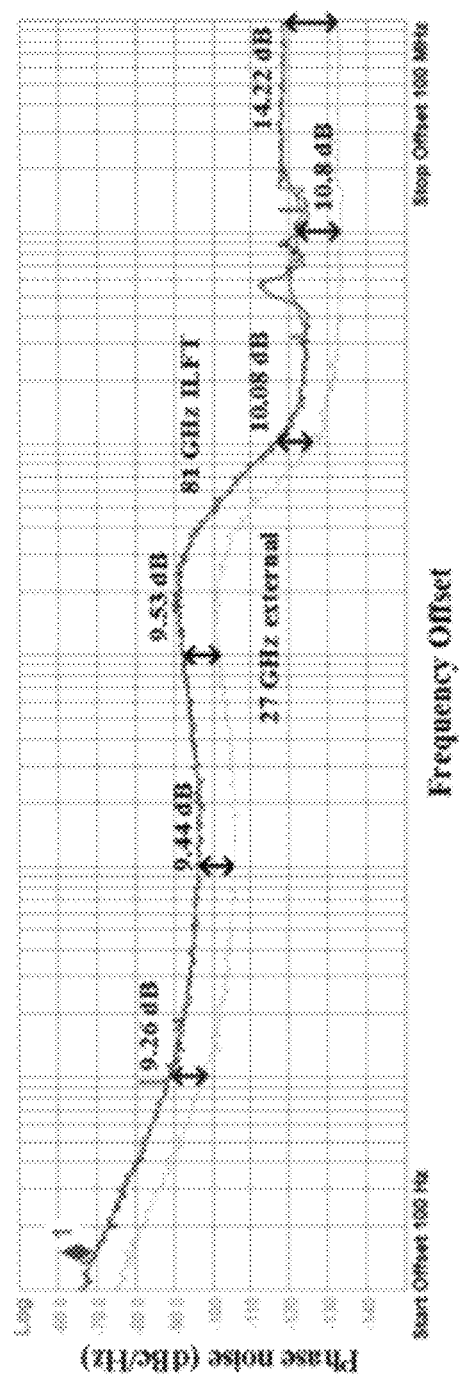
FIG. 8 is a plot showing measured phase noise of the oscillator circuit of FIG. 5 when $f_{in}$=27 Ghz.

Advantageously, the tunability feature may also be beneficial to accommodating the operation against process variations. The largest LR is 21.6 GHz (27.07$) from 69 to 90.6 GHz at $V_{tune}$=0.5 V. The current and power consumption of the tripler core are 9.8 mA and 5.88 mW, respectively. Preferably, under injection locking, the phase noise of the ILFT is mainly dictated by the injected signal (27 GHz). At 1 MHz offset from the carrier, the measured phase noise is better than −115.01 dBc/Hz at 81 GHz, as shown in FIG. 8.

In addition, because of the multiplication factor (3 in this example) between 27 GHz and 81 GHz, the ILFT phase noise should be degraded with respect to the injected external signal phase noise by a factor of 20 $\log_{10}3$=9.54 dB. Although, FIG. 8 shows that the measured phase noise degradation is of 10.8 dB at 10 MHz offset and 14.22 dB at 100 MHz offset which are higher than the expected 9.54 dB. For such rise of the phase noise is ascribable to the noise floor of the circuits involved in the subharmonic injection and in the n-th harmonic generation.

Since the important multiplier parameters include the operation frequency ($f_0$), locking range (LR), power consumption (PDC), input power ($P_{inj}$), and multiplication factor (MF), the figure-of-merit (FOM) may be defined as:

$$FOM = \frac{LR(\%) \times MF}{P_{DC} \times P_{inj}} \quad (5)$$

The following table shows the performance summary of MMW injection locked frequency multipliers in some Examples in which the performance of the oscillator of the preferred embodiment is list on the last row of the table. The power consumption of the proposed ILFT is comparable to the other examples, however a wider LR (>21.6 GHz) may be achieved and the calibration can be simplified with respect to the frequency control.

| Tech. (nm) | $P_{inj}$ (dBm) | MF | $V_{tune}$ (V) | LR (GHz) | $P_{DC}$ (mW) | FOM |
|---|---|---|---|---|---|---|
| 90 | −1 | 3 | N | 91.5-97.4 (6.3%) | 1 | 23.7 |
| 90 | 3 | 3 | N | 99.9-110.7 (10.3%) | 8.5 | 1.82 |
| 130 | 6 | 3 | 0-1.5 | 59.3-60.7 (2.37%) | 1.86 | 0.96 |
| 65 | 0 | 3 | 0-0.8 | 85-95 (11%) | 5.2 | 6.35 |
| 65 | 3.4-4.1 | 2 | 0-1.2 | 69.2-94.6 (31%) | 9.7 | 2.92 |
| | 0 | | | 72-92.5 (25%) | | 5.15 |
| 65 | 0 | 6 | N | 74.7-82.2 (9.6%) | 6.3 | 9.14 |
| 65 | 0 | 3 | 0.5 | 69-90.6 (27.1%) | 5.88 | 13.8 |

In addition, the power consumption of the wide LR tripler is only 5.88 mW under 0.6 V supply voltage. The LR of 27.1% (from 69 to 90.6 GHz) with an excellent FOM performance is achieved. The measured phase noise is better than −115.01 dBc/Hz @ 1 MHz at 81 GHz. The deterioration between the injected signal and the multiplied output signal is only 10.08 dB which is closed to the theoretical calculation.

Unlike other traditional circuit topologies used for communications at lower frequencies ported to millimetre wave frequencies, the oscillator of the present invention does not require large power consumption. Injection locking also allow for high-frequency operations with relatively low power consumption.

These embodiments may be advantageous in that, by using a dual-resonance transformer tank, a dual-band VCO with easy control of the oscillating frequency may be obtained. Based on this VCO, the subharmonic signal is injected through the transformer by magnetic coupling. The oscillator circuit may be easily implemented for low-voltage and high performance MMW applications.

The operation of the injection-locked frequency tripler is simple which involve choosing a proper coupling factor k such that the phase of tank is less than the locking phase over a large frequency range so that a wide LR is obtained.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

Any reference to prior art contained herein is not to be taken as an admission that the information is common general knowledge, unless otherwise indicated.

The invention claimed is:

1. An injection-locked frequency multiplier circuit comprising:
a core stage including a voltage-controlled oscillator arranged to output an output oscillation signal, and
an input stage coupled to the core stage via an induction coupling, and arranged to receive an input oscillation signal;
wherein the output oscillation signal includes an output oscillation frequency substantially equal to a multiplication of an input oscillation frequency of the input oscillation signal; wherein the input stage further comprises a primary coil and wherein the core stage further comprises a secondary coil magnetically coupled with the primary coil to form the induction coupling; and wherein the input stage is further arranged to inject a subharmonic signal to the core stage via the induction coupling such that the output oscillation frequency is generated in the core stage; wherein the input stage further comprises a pair of injection transistors arranged to receive the input oscillation signal; and wherein the input stage further comprises a cascode stage between the pair of injection transistors and the induction coupling, wherein the cascode stage arranged to maintain a constant capacitance in the inductive coupling during a switching operation of the pair of injection transistors.

2. The injection-locked frequency multiplier circuit in accordance with claim 1, wherein the output oscillation frequency substantially equals a triple of the input oscillation frequency.

3. The injection-locked frequency multiplier circuit in accordance with claim 1, wherein the induction coupling includes a magnetic coupling.

4. The injection-locked frequency multiplier circuit in accordance with claim 1, wherein the combination of the primary coil and the secondary coil defines a transformer.

5. The injection-locked frequency multiplier circuit in accordance with claim 4, wherein an output port of the transformer is operable as a signal source of the voltage-controlled oscillator.

6. The injection-locked frequency multiplier circuit in accordance with claim 1, wherein the core stage further comprises a pair of variable capacitors coupled with the secondary coil, wherein the pair of variable capacitors is arranged to manipulate a center frequency of the voltage-controlled oscillator.

7. The injection-locked frequency multiplier circuit in accordance with claim 6, wherein the center frequency of the voltage-controlled oscillator matches with a self-resonate frequency of the secondary coil.

8. The injection-locked frequency multiplier circuit in accordance with claim 6, wherein the pair of variable capacitors are further arranged to compensate process and/or temperature variations in the core stage during an operation of the oscillator circuit.

9. The injection-locked frequency multiplier circuit in accordance with claim 6, wherein the pair of variable capacitors include a pair of varactors.

10. The injection-locked frequency multiplier circuit in accordance with claim 1, wherein the core stage further comprises a pair of cross-coupled transistors connected with the secondary coil to define a core of the voltage-controlled oscillator.

11. The injection-locked frequency multiplier circuit in accordance with claim 10, wherein the pair of cross-coupled transistors are cross-coupled to generate a negative impedance.

12. The injection-locked frequency multiplier circuit in accordance with claim 10, further comprising an output stage arranged to output the output oscillation signal generated by the core of the voltage-controlled oscillator.

13. The injection-locked frequency multiplier circuit in accordance with claim 12, wherein the output stage includes a pair of buffer circuits connected to the core of the voltage-controlled oscillator.

14. The injection-locked frequency multiplier circuit in accordance with claim 1, wherein the pair of injection transistors are biased at an optimized gate voltage so as to widen a locking range of the voltage-controlled oscillator.

15. The injection-locked frequency multiplier circuit in accordance with claim 1, wherein the pair of injection transistors are biased at an optimized gate voltage so as to maximize the subharmonic signal.

16. The injection-locked frequency multiplier circuit in accordance with claim 1, wherein the cascode stage includes one or more transistors.

17. An injection-locked frequency multiplier circuit comprising:
a core stage including a voltage-controlled oscillator arranged to output an output oscillation signal; and
an input stage an input stage coupled to the core stage via an induction coupling, and arranged to receive an input oscillation signal; wherein the output oscillation signal includes an output oscillation frequency substantially equal to a multiplication of an input oscillation frequency of the input oscillation signal; wherein the input stage further comprises a primary coil and wherein the core stage further comprises a secondary coil magnetically coupled with the primary coil to form the induction coupling; wherein the input stage is further arranged to inject a subharmonic signal to the core stage via the induction coupling such that the output oscillation frequency is generated in the core stage; wherein the voltage controlled oscillator includes a dual band voltage controlled oscillator; wherein the dual band voltage controlled oscillator and the inductive coupling are arranged to resonate at two different resonant frequencies ωL and ωH wherein a ratio of the two different resonant frequencies ωL/ωH is related to a coupling coefficient k of the inductive coupling; wherein the coupling coefficient k is related to the following representations:

$$\rho = \frac{\text{Re} Z_{11}(\omega_L)}{\text{Re} Z_{11}(\omega_H)} \approx \frac{k + (\gamma - 1)}{k - (\gamma - 1)}; \text{ and } \frac{\omega_L}{\omega_H} = \sqrt{\frac{1 + \gamma^2 - \sqrt{\Delta}}{1 + \gamma^2 + \sqrt{\Delta}}}$$

where $$\Delta=(1-\gamma^2)^2+4k^2\gamma^2;$$

wherein $Z_{11}(\omega)$ denotes a magnitude peak corresponding to a pole frequency, $\gamma$ is a parameter associated with an LRC-circuit model of the inductive coupling; and $\rho$ is a ratio of an equivalent parallel resistance of the LRC-circuit model in two frequency modes.

18. The injection-locked frequency multiplier circuit in accordance with claim 17, wherein each of the two different resonant frequencies $\omega_L$ and $\omega_H$ defines two respective locking ranges, wherein the two locking ranges at least partially overlaps with each other so as to define a wide and continuous locking range.

\* \* \* \* \*